United States Patent
Tanino et al.

(12) 
(10) Patent No.: US 6,436,186 B1
(45) Date of Patent: Aug. 20, 2002

(54) MATERIAL FOR RAISING SINGLE CRYSTAL SIC AND METHOD OF PREPARING SINGLE CRYSTAL SIC

(75) Inventors: Kichiya Tanino; Masanobu Hiramoto, both of Sanda (JP)

(73) Assignee: Nissin Electric Co., Ltd., Kyoto (JP)

( * ) Notice: Subject to any disclaimer, the term of this patent is extended or adjusted under 35 U.S.C. 154(b) by 0 days.

(21) Appl. No.: 09/805,778

(22) PCT Filed: Jul. 30, 1999

(86) PCT No.: PCT/JP99/04097

§ 371 (c)(1),
(2), (4) Date: Mar. 20, 2001

(87) PCT Pub. No.: WO01/09412

PCT Pub. Date: Feb. 8, 2001

(51) Int. Cl.$^7$ ................................................. C30B 25/02
(52) U.S. Cl. ................... 117/4; 117/7; 117/8; 117/9; 117/84; 117/88; 117/951
(58) Field of Search ............... 117/4, 7, 8, 9, 117/84, 88, 951; 423/345

(56) References Cited

U.S. PATENT DOCUMENTS 6,143,267 A  * 11/2000  Tanino .................. 423/345
6,153,166 A  * 11/2000  Tanino .................. 423/345
6,217,842 B1 *  4/2001  Tanino .................. 423/345

FOREIGN PATENT DOCUMENTS

| JP | 10-324600 | 12/1998 |
| JP | 11-12097 | 1/1999 |
| JP | 11-12100 | 1/1999 |
| JP | 11-92293 | 4/1999 |

* cited by examiner

*Primary Examiner*—Felisa Hiteshew
(74) *Attorney, Agent, or Firm*—Jones, Tullar & Cooper, P.C.

(57) ABSTRACT

According to the invention, a complex (M or M') formed by stacking in a closely contacted state a single crystal α-SiC base material (1) and a polycrystalline plate (2) which is produced into a plate-like shape by the CVD method with interposing an intermediate layer (4 or 4') containing Si and O as fundamental components, such as silicon rubber between opposing faces of the two members (1) and (2) in a laminated manner is heat-treated at a temperature of 2,200° C. or higher, and under a saturated SiC vapor pressure, thereby causing polycrystal members of the polycrystalline plate (3) to be transformed in a same direction as single crystal of the single crystal α-SiC base material (1) to integrally grow single crystal. Therefore, single crystal SiC of a high quality in which crystal defects and distortion are prevented from occurring and micropipe defects hardly occur can be produced easily and efficiently.

16 Claims, 3 Drawing Sheets

MATERIAL FOR RAISING SINGLE CRYSTAL SIC AND METHOD OF PREPARING SINGLE CRYSTAL SIC

TECHNICAL FIELD

The present invention relates to a material for growing single crystal SiC and a method of producing single crystal SiC, and more particularly to a material for growing single crystal SiC which is used as a substrate wafer for a high temperature/high frequency semiconductor electronic element such as a light-emitting diode, an X-ray optical element, a switching element, an amplifying element, and an optical sensor, and also to a method of producing such single crystal SiC.

BACKGROUND ART

SiC (silicon carbide) is superior in heat resistance and mechanical strength than existing semiconductor materials such as Si (silicon) and GaAs (gallium arsenide), and has good resistance to radiation. In addition, it is easy to perform the valence control of electrons and holes by doping an impurity. Moreover, SiC has a wide band gap (for example, single crystal 6H-SiC has a band gap of about 3.0 eV, and single crystal 4H-SiC has a band gap of 3.26 eV). Therefore, it is possible to realize a large capacity, a high-frequency property, a dielectric property, and a resistance to environments which cannot be realized by the above-mentioned existing semiconductor materials. SiC receives attention and is expected as a semiconductor material for a next-generation power device.

As a method of producing (growing) single crystal SiC of this type, conventionally known are: the modified sublimation and recrystallization method (modified Lely method) in which a seed crystal is placed in a graphite crucible and the gas sublimating from SiC serving as a raw material is diffusively transported in a closed space to be recrystallized on the seed crystal that is set to a low temperature; the high-temperature epitaxial method in which epitaxial growth is conducted on a silicon substrate by using the chemical vapor deposition method (CVD method), thereby growing single crystal cubic SiC (β-SiC); the magnetron sputtering method; and the plasma CVD method.

Among the above-mentioned conventional production methods, in the modified sublimation and recrystallization method, however, impurities enter during a step of growing a crystal to lower the impurity, two or more polytypes mixedly exist in the same crystal, and crystal defects are easily introduced into the interface. In addition, pin holes which are called micropipe defects, which cause a leakage current when a semiconductor device is produced, which pass through the crystal in the growing direction, and which have a diameter of several microns easily remain at about 300 to 1,000/$cm^2$ in a grown crystal. Therefore, the method is problematic in quality.

In the high-temperature epitaxial method, the substrate temperature is so high that the amount of reevaporation is large, and it is therefore required to produce a high-purity reducing atmosphere. Consequently, the method has problems in that it is difficult to practically conduct the method from the viewpoint of installation, and that, because of epitaxial growth, the crystal growth rate is naturally limited, and hence the productivity of single crystal SiC is very poor.

In the magnetron sputtering method and the plasma CVD method, the installation is massive, and defects such as micropipe defects are inevitably produced.

As described above, in the conventional methods of producing single crystal SiC, satisfactory single crystal SiC cannot be obtained from the viewpoints of installation, and the quality due to production of micropipe defects or the like. These problems are the main cause of blocking a practical use of single crystal SiC which has superior characteristics as compared with existing semiconductor materials such as Si and GaAs as described above.

Under these circumstances, the inventors have developed and proposed a method in which a complex configured by stacking in a closely contacted state a single crystal SiC base material and a polycrystalline plate consisting of Si atoms and C atoms is heat-treated under a condition where the base material side is placed in a lower low-temperature side of a heat treatment oven, whereby polycrystal members of the polycrystalline plate are transformed in imitation of single crystal of the single crystal base material so that single crystal SiC oriented in the same direction as single crystal of the single crystal base material is integrally grown.

According to the above-mentioned method of producing single crystal SiC which has been developed and proposed by the inventors (hereinafter, referred to as the proposed production method), Si atoms and C atoms do not constitute large crystal grains between the single crystal SiC base material and the polycrystalline plate, and a heat treatment is conducted under a state where an SiC layer in which a part of or the substantial whole of the Si and C atoms exist as a single member is interposed. Therefore, Si atoms and C atoms diffusively move in an interface between the single crystal SiC base material and the polycrystalline plate, and a single crystal can be integrally grown by solid-phase growth in which the diffusively moving Si and C atoms are simultaneously rearranged over a substantially whole area of the surface of the single crystal SiC base material which is on the low-temperature side, in imitation of single crystal of the single crystal SiC base material. Furthermore, impurities are prevented from entering from the atmosphere to the interface, whereby occurrence of crystal defects and distortion can be suppressed, and also occurrence of micropipe defects can be reduced. Therefore, the proposed production method has an advantage that single crystal SiC of a high quality can be grown with high productivity as compared with the above-mentioned conventional production methods.

The above-mentioned proposed production method has been further investigated. Finally, it has been found that, in order to grow single crystal SiC of a higher quality with higher productivity, the followings are important: to uniformly maintain the closely contacted state between the single crystal SiC base material and the polycrystalline plate, over the whole face; not to apply distortion on single crystal of the base material; and to uniformly maintain the temperature difference between opposing faces of the single crystal SiC base material and the polycrystalline plate over the whole region during heat treatment, to expedite lattice rearrangement of Si and C atoms which sublimate from the polycrystalline plate, in the surface of the base material in imitation of the underground single crystal SiC. The proposed production method has room for improvement in these points.

DISCLOSURE OF INVENTION

The invention has been conducted in view of the above-mentioned circumstances of the prior art. It is an object of the invention to provide a material for growing single crystal SiC that enables single crystal SiC of a very high quality in which micropipe defects and the like hardly occur, and a method of producing single crystal SiC which can produce single crystal SiC of a high quality easily and with high productivity from the viewpoints of installation and workability, thereby expediting practical use of single crystal SiC as a semiconductor material.

The material for growing single crystal SiC according to the first invention is characterized in that the base material is configured by a complex formed by stacking in a closely contacted state a single crystal SiC base material and a polycrystalline plate consisting of Si atoms and C atoms with interposing an organic or inorganic substance between opposing faces of the two members in a laminated manner, fundamental components of the substance being Si and O, and the complex is heat-treated to cause polycrystal members of the polycrystalline plate to be transformed in a same direction as single crystal of the single crystal SiC base material, thereby enabling single crystal to be grown. The method of producing single crystal SiC according to the second invention is characterized in that a single crystal SiC base material and a polycrystalline plate consisting of Si atoms and C atoms are stacked in a closely contacted state with interposing an organic or inorganic substance between opposing faces of the two members in a laminated manner, fundamental components of the substance being Si and O, and the complex is then heat-treated to cause polycrystal members of the polycrystalline plate to be transformed in a same direction as single crystal of the SiC single crystal base material, thereby integrally growing single crystal.

According to the first and second inventions having such constituents, since the organic or inorganic substance containing Si and O as fundamental components is interposed in a laminated manner between the opposing faces of the single crystal SiC base material and the polycrystalline plate, (a) the closely contacted state of the opposing faces can be uniformly held over the whole face without producing a gap between the opposing faces of the base material and the polycrystalline plate. (b) The interposed organic or inorganic substance forms an amorphous (glassy) layer of a low thermal conductivity, and the temperature difference between the opposing faces of the base material and the polycrystalline plate can be maintained substantially uniformly over the whole region during heat treatment under a state where the base material side is lower in temperature. (c) With the advance of the heat treatment, Si and O which are the fundamental components of the intermediate layer are thermally decomposed, and the intermediate layer enters a mixed state in which Si seeds and arbitrary O seeds (for example, radicals, ions, and the like) are contained. In this state, the atomic bonding between an Si atom and a C atom in the contacting face on the side of the polycrystalline plate is weakened particularly by the electron withdrawing function of the O seeds, and the stereoscopic function in which, for example, the O seeds enter Si-C lattices to produce distortion in the lattice interval. Then, Si atoms and C atoms which are produced as a result of breakage of the bond in the contacting face portion rapidly diffusively move in the intermediate layer having a temperature gradient of 100° C. or larger. At the instance when the atoms reach the surface of the base material which is held to a low temperature and stable, lattice rearrangement of Si and C atoms in imitation of single crystal of the base material is caused so that signal crystals can be integrally grown. (d) Since the closely contacted state of the opposing faces of the base material and the polycrystalline plate is uniformly held over the whole face, it is possible to prevent impurities from entering from the atmosphere to the interface during heat treatment. (e) Even during heat treatment, the temperature of the base material is held to a low level, and hence single crystal of the base material can be stabilized.

As described above, when the organic or inorganic substance containing Si and O as fundamental components is interposed between the opposing faces of the single crystal SiC base material and the polycrystalline plate, the functions of (a) to (e) above can be attained. By a synergistic effect of these functions, even when only means for heat-treating the complex which is simple from the viewpoints of installation and workability is provided, single crystal SiC of a very high quality in which crystal defects and distortion of the base material can be prevented from occurring and micropipe defects hardly occur can be obtained with high productivity. As a result, it is possible to attain an effect that the practical use of single crystal SiC which is superior in a high temperature property, a high frequency property, a dielectric property, and a resistance to environments to existing semiconductor materials such as Si (silicon) and GaAs (gallium arsenide) and which is expected as a semiconductor material for a power device is enabled.

In the material for growing single crystal SiC according to the first invention and the method of producing single crystal SiC according to the second invention, preferably, single crystal α-SiC is used as the single crystal SiC base material. In consideration of further enhancement of the quality of single crystal SiC, it is preferable to use a member which is produced into a plate-like shape by the thermochemical vapor deposition method (hereinafter, referred to as the thermal CVD method) in which impurities enter at the lowest degree is used as the polycrystalline plate. Alternatively, amorphous SiC or a high-purity SiC sintered member may be used.

In the material for growing single crystal SiC according to the first invention and the method of producing single crystal SiC according to the second invention, the intermediate layer may be interposed in a liquid phase state, whereby it is possible to completely eliminate formation of a gap between the opposing faces of the base material and the polycrystalline plate, so as to ensure the closely contacted state of the opposing faces.

In the material for growing single crystal SiC according to the first invention and the method of producing single crystal SiC according to the second invention, when silicon or a silicon compound including silicon rubber, silicon resin, silicon oil, and silicon grease is used as the organic or inorganic substance forming the intermediate layer, the intermediate layer can be formed by simple means such as application, so that the base material configured by the complex can be easily produced and the production cost can be reduced. Alternatively, the single crystal SiC base material or the polycrystalline plate itself may be thermally oxidized to form an $SiO_2$ film in the surface, and the film may be used as the intermediate layer.

In the method of producing single crystal SiC according to the second invention, a complex in which the polycrystalline plate is formed to be larger than the single crystal SiC base material may be used, and the complex may be heat treated while the complex is placed on a support table in a heat treatment oven so that a portion which is on the side of the single crystal SiC base material and which is smaller is positioned in a lower side. According to this configuration, the polycrystalline plate which is larger easily receives radiation heat in the oven, a temperature difference is easily produced, and the heat distribution over the whole area of the interface is easily uniformalized. Therefore, the growing rate of the single crystal SiC can be increased, so that the productivity can be further improved.

When a graphite sheet is laid on a face of the support table in the heat treatment oven, the single crystal SiC base material being to be placed on the face, the support table made of sintered graphite and the single crystal SiC base material can be prevented from sticking together, and heat can be uniformly applied over the whole area of the single crystal SiC base material.

BEST MODE FOR CARRYING OUT THE INVENTION

Figure 1:
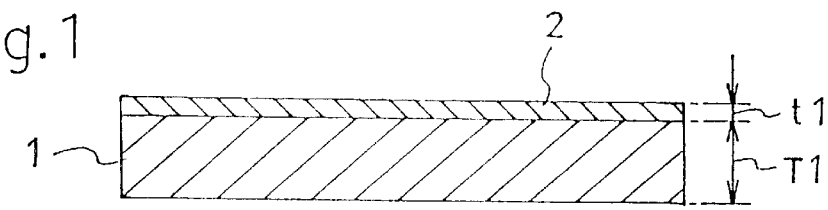
FIG. 1 and FIG. 2 are diagrams illustrating production steps of the material for growing single crystal SiC in a first embodiment of the invention.

Hereinafter, a first embodiment will be described. FIG. 1 shows a single crystal SiC base material which is one element of the material for growing single crystal SiC. A plate-like hexagonal (6H type or 4H type) single crystal α-SiC base material 1 which is produced by the sublimation recrystallization method is used as the single crystal SiC base material. The single crystal α-SiC base material 1 has a size of a thickness T1 of 0.3 cm and length×width of 1.2 mm square. The surface of the base material is coated with a solution (for example, product name: AEROSIL) in which fine grain silica powder that is produced by the vapor phase method so as to have a particle diameter of 80 angstroms is dissolved in ethanol, as an example of the organic or inorganic substance containing Si and O as fundamental components, to form a coating film 2 having a thickness t1 of 100 to 3,000 angstroms.

Figure 2:
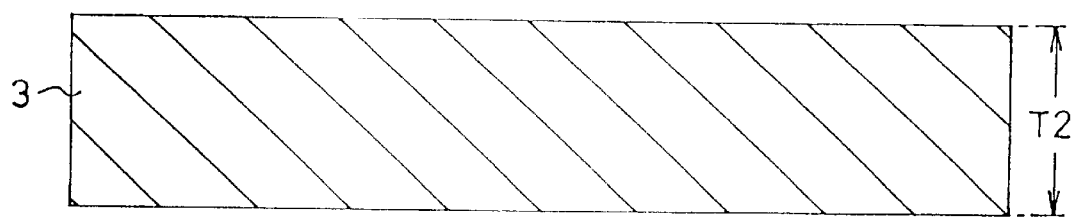

FIG. 2 shows a polycrystalline plate which is the other element of the material for growing single crystal SiC. The polycrystalline plate 3 is produced by the thermal CVD method into a disk-like shape having a thickness T2 of 0.7 cm and a diameter of 2.0 cm.

Figure 3:
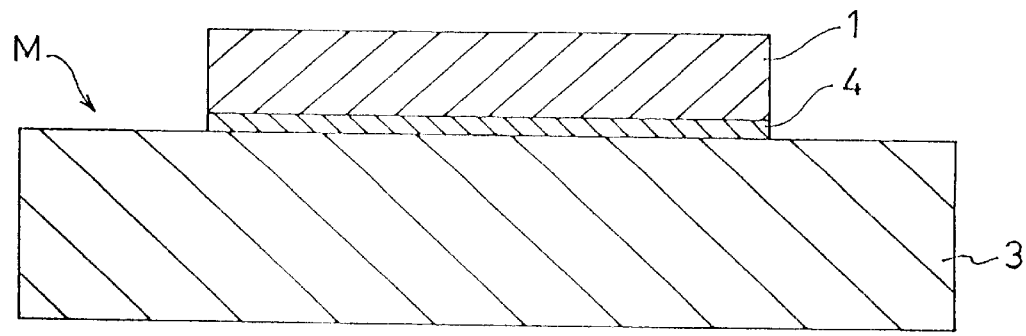
FIG. 3 is a diagram of the material (complex) for growing single crystal SiC of the first embodiment.

The disk-like polycrystalline plate 3 shown in FIG. 2 is stacked in a closely contacted state on the coating film 2 of the single crystal α-SiC base material 1 shown in FIG. 1, and bonded thereto, thereby producing a complex (base material) M in which, as shown in FIG. 3, an intermediate layer 4 made of an organic or inorganic substance containing Si and O as fundamental components is interposed between opposing faces of the two members 1 and 3.

Figure 4:
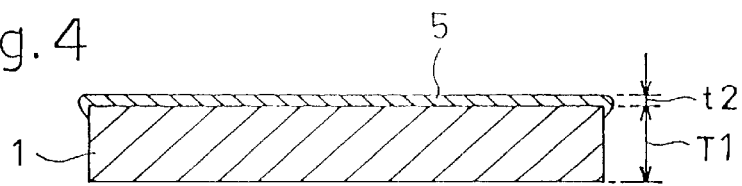
FIG. 4 and FIG. 5 are diagrams illustrating production steps of the material for growing single crystal SiC in a second embodiment of the invention.

Next, a second embodiment will be described. FIG. 4 shows a single crystal SiC base material which is one element of the material for growing single crystal SiC. In the same manner as the first embodiment, a plate-like hexagonal (6H type or 4H type) single crystal α-SiC base material 1 which is produced by the sublimation recrystallization method is used as the single crystal SiC base material. The single crystal α-SiC base material 1 has a size of a thickness T1 of 0.3 cm and length×width of 1.2 mm square. The surface of the base material is spray coated with a coating composition of silicon rubber {for example, product name: RTV silicone spray produced by FINE CHEMICAL JAPAN CO., LTD.} as another example of the organic or inorganic substance containing Si and O as fundamental components, to form a coating film 5 having a thickness t2 of 500 to 30,000 angstroms.

Figure 5:
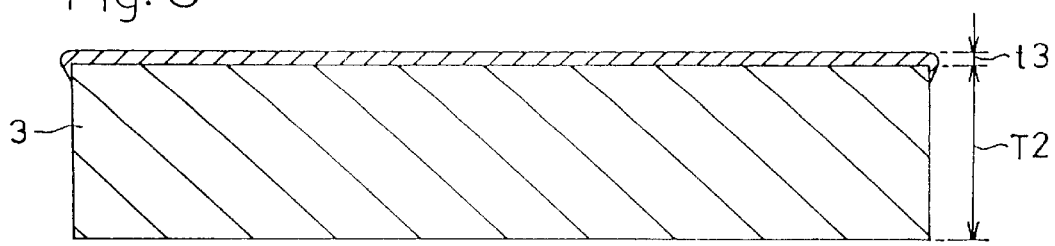

FIG. 5 shows a polycrystalline plate which is the other element of the material for growing single crystal SiC. In the same manner as the first embodiment, the polycrystalline plate 3 is produced by the thermal CVD method into a disk-like shape having a thickness T2 of 0.7 cm and a diameter of 2.0 cm. The surface of the plate material is spray coated with a coating composition of silicon rubber {for example, product name: RTV silicone spray produced by FINE CHEMICAL JAPAN CO., LTD.} as another example of the organic or inorganic substance containing Si and O as fundamental components, to form a coating film 6 having a thickness t3 of 500 to 30,000 angstroms.

Figure 6:
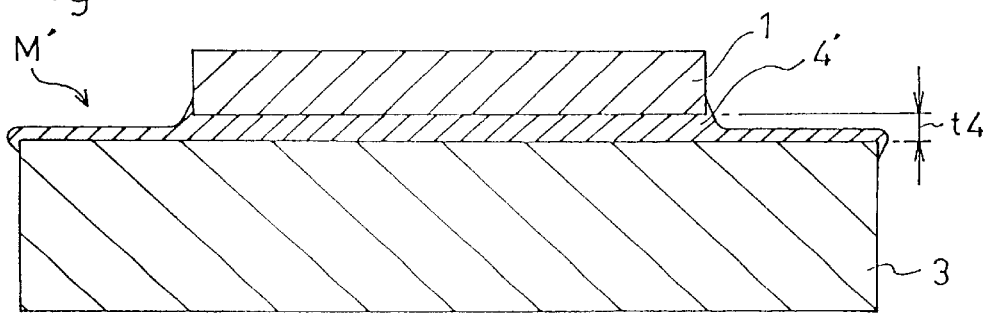
FIG. 6 is a diagram of the material (complex) for growing single crystal SiC of the second embodiment.

The single crystal α-SiC base material 1 shown in FIG. 4 and the disk-like polycrystalline plate 3 shown in FIG. 5 are stacked and bonded together so that the coated faces are closely contacted with each other, before the coating films 5 and 6 formed on the respective surfaces are hardened, thereby producing a complex (base material) MI in which, as shown in FIG. 6, an intermediate layer 4' configured by the coating films 5 and 6 and having a thickness t4 of 1 μm to 60 μm is interposed between opposing faces of the two members 1 and 3.

Figure 7:
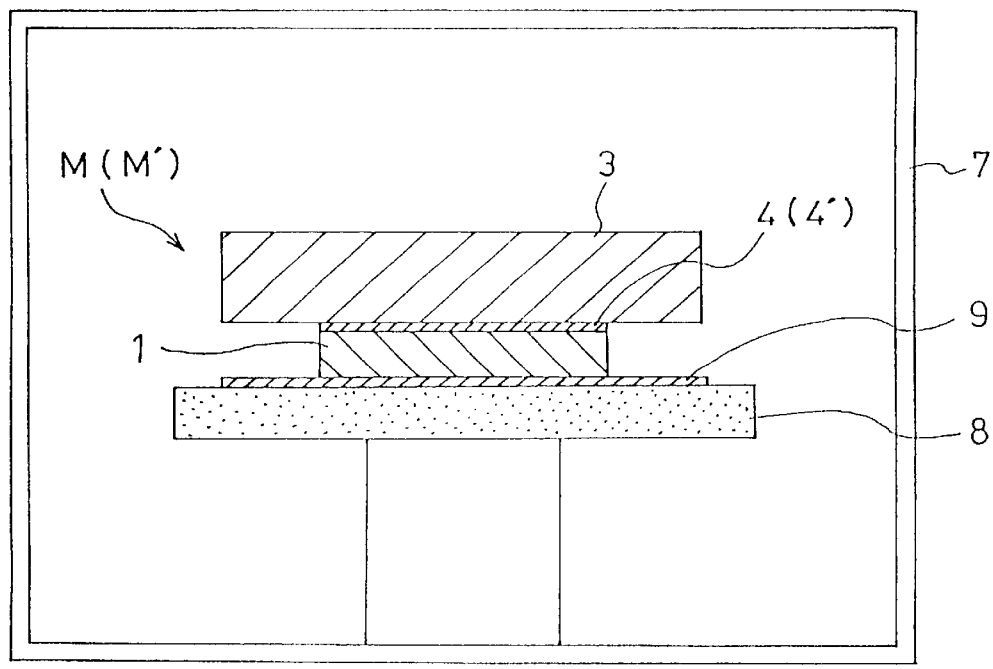
FIG. 7 is a diagram showing a heat treatment state of a complex.

As shown in FIG. 7, the complex M or M' is introduced into a resistance heating oven 7, and then placed in a horizontal posture on a graphite sheet 9 which is laid on the surface of a support table 8 made of sintered graphite in the oven, in such a manner that the single crystal α-SiC base material 1 which is smaller is positioned in the lower side.

Under this conditions, a flow of an inert gas such as Ar is injected into the oven 7, and the temperature is raised at an average rate until the average oven temperature reaches 2,200° C., and the average oven temperature of 2,200° C. is then maintained for about one hour. In this way, a heat treatment is performed in an inert gas atmosphere at the atmospheric pressure and under a saturated SiC vapor pressure.

In this heat treatment, the polycrystalline plate 3 which is placed in the high-temperature side of the oven is originally large in shape, and hence receives a large amount of radiation heat. Since the intermediate layer 4 or 4' which has a lower thermal conductivity is interposed, a temperature difference of 100° C. or larger is produced between the polycrystalline plate and the single crystal α-SiC base material 1 which is placed in the low-temperature side of the oven. Furthermore, because of the size difference in shape and the existence of the graphite sheet 9, the heat distribution in the plane direction of the interface is uniform, and the whole of the complex M or M' is uniformly heated in a state where the temperature difference is produced.

Figure 8:
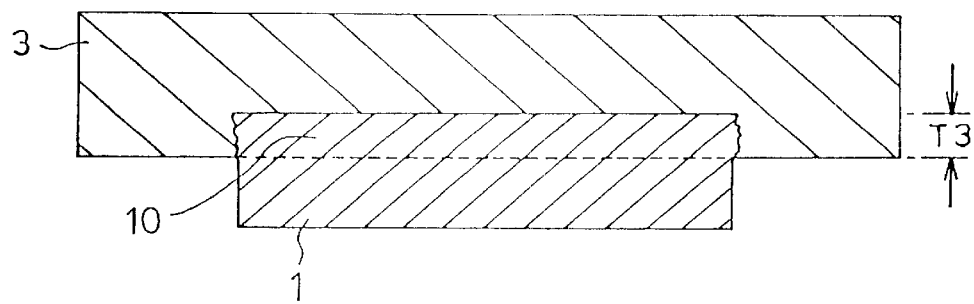
FIG. 8 is a diagram showing a state after the heat treatment.

With the advance of the heat treatment, Si and O which are fundamental components of the intermediate layer 4 or 4' are thermally decomposed, and the intermediate layer enters an mixed state in which Si seeds and arbitrary O seeds (for example, radicals, ions, and the like) are contained. In this state, the atomic bonding between an Si atom and a C atom in the contacting face portion on the side of the polycrystalline plate 3 is weakened particularly by the electron withdrawing function of the O seeds, and the stereoscopic function in which, for example, the O seeds enter Si—C lattices to produce distortion in the lattice interval. Then, Si atoms and C atoms which are produced as a result of breakage of the bond in the contacting face portion rapidly diffusively move in the intermediate layer having a temperature gradient of 100° C. or larger. At the instance when the atoms reach the surface of the single crystal α-SiC base material 1 which is held to a low temperature and stable, lattice rearrangement of Si and C atoms in imitation of the single crystal is caused. Finally, as shown in FIG. 8, the intermediate layer 4 or 4' vanishes, and a portion of a thickness T3 of about 300 $\mu$m from the interface of the polycrystalline plate 3 is grown by rearrangement of atoms, integrally with a single crystal portion 10 oriented in the same direction as single crystal of the single crystal α-SiC base material 1, so that a grown layer in which the number of micropipes is very smaller than the seed crystal 1 (the number of micropipes of the single crystal portion 10=100/cm$^2$ or less) is obtained.

In the complex M or M', the closely contacted state of the opposing faces of the single crystal α-SiC base material 1 and the polycrystalline plate 3 can be uniformly held over the whole face by the interposition of the intermediate layer 4 or 4', and no gap is formed. Therefore, any entering of impurities from the atmosphere to the interface during heat treatment is not observed.

As described above, single crystal SiC of a very high quality in which crystal defects and distortion of the single crystal α-SiC base material 1 can be prevented from occurring and micropipe defects hardly occur can be obtained with high productivity, by applying only means that is simple from the viewpoints of installation and workability, i.e., heat treating the complex (base material) M or M' in which the intermediate layer 4 or 4' made of an organic or inorganic substance containing Si and O as fundamental components is interposed between the opposing faces of the base material 1 and the polycrystalline plate 3. Therefore, it is possible to expedite the practical use of single crystal SiC which is superior in a high temperature property, a high frequency property, a dielectric property, and a resistance to environments to existing semiconductor materials such as Si (silicon) and GaAs (gallium arsenide) and which is expected as a semiconductor material for a power device.

In the embodiments described above, the single crystal α-SiC base material 1 is used as the single crystal SiC base material. Alternatively, for example, an α-SiC sintered member or a single crystal β-SiC member may be used. In the embodiments, a member which is produced into a plate-like shape by the thermal CVD method is used as the polycrystalline plate configured by Si atoms and C atoms. Alternatively, for example, amorphous SiC, a high-purity SiC sintered member, or an α-SiC polycrystalline plate may be used.

In the embodiments, silicon or a silicon compound is used as the intermediate layer 4 or 4'. Alternatively, the single crystal α-SiC base material 1 or the polycrystalline plate 3 itself may be thermally oxidized to form an SiO$_2$ film in the surface.

Industrial Applicability

As described above, the invention is a technique that a single crystal SiC base material and a polycrystalline plate are stacked in a closely contacted state with interposing an intermediate layer made of an organic or inorganic substance between opposing faces of the two members in a laminated manner, fundamental components of the substance being Si and O, and the complex is then heat-treated to cause polycrystal members of the polycrystalline plate to be transformed in the same direction as single crystal of the SiC single crystal base material in imitation of the single crystal, whereby single crystal SiC of a very high quality which is superior in heat resistance and mechanical strength, and in which not only crystal defects and distortion but also micropipe defects hardly occur can be produced easily and efficiently.

What is claimed is:

1. A material for growing single crystal SiC wherein said material is configured by a complex formed by stacking in a closely contacted state a single crystal SiC base material and a polycrystalline plate consisting of Si atoms and C atoms with interposing an organic or inorganic substance between opposing faces of said two members in a laminated manner, fundamental components of said substance being Si and O, and said complex is heat-treated to cause polycrystal members of said polycrystalline plate to be transformed in a same direction as single crystal of said single crystal SiC base material, thereby enabling single crystal to be grown.

2. A material for growing single crystal SiC according to claim 1, wherein said single crystal SiC base material is single crystal α-SiC.

3. A material for growing single crystal SiC according to claim 1, wherein said single crystal SiC base material is amorphous SiC, a high-purity SiC sintered member, or an SiC polycrystalline plate which is produced into a plate-like shape by a thermochemical vapor deposition method.

4. A material for growing single crystal SiC according to claim 1, wherein said intermediate layer is interposed in a liquid phase state.

5. A material for growing single crystal SiC according to claim 1, wherein said organic or inorganic substance which forms said intermediate layer and which contains Si and O as fundamental components is silicon or a silicon compound including silicon rubber, silicon resin, silicon oil, and silicon grease.

6. A material for growing single crystal SiC according to claim 1, wherein said organic or inorganic substance which forms said intermediate layer and which contains Si and O as fundamental components is an SiO$_2$ film which is formed in a surface of said single crystal SiC base material or said polycrystalline plate by thermally oxidizing said base material or said plate itself.

7. A material for growing single crystal SiC according to claim 1, wherein said intermediate layer has a thickness of 1 to 60 $\mu$m.

8. A method of producing single crystal SiC wherein a single crystal SiC base material and a polycrystalline plate consisting of Si atoms and C atoms are stacked in a closely contacted state with interposing an organic or inorganic substance between opposing faces of said two members in a laminated manner, fundamental components of said substance being Si and O, and said complex is heat-treated to cause polycrystal members of said polycrystalline plate to be transformed in a same direction as single crystal of said single crystal SiC base material, thereby integrally growing single crystal.

9. A method of producing single crystal SiC according to claim 8, wherein single crystal α-SiC is used as said single crystal SiC base material.

10. A method of producing single crystal SiC according to claim 8, wherein amorphous SiC, a high-purity SiC sintered member, or an SiC polycrystalline plate which is produced into a plate-like shape by a thermochemical vapor deposition method is used as said polycrystalline plate.

11. A method of producing single crystal SiC according to claim 8, wherein said intermediate layer is interposed in a liquid phase state.

12. A method of producing single crystal SiC according to claim 8, wherein silicon or a silicon compound including silicon rubber, silicon resin, silicon oil, and silicon grease is used as said organic or inorganic substance which forms said intermediate layer and which contains Si and O as fundamental components.

13. A method of producing single crystal SiC according to claim 8, wherein an $SiO_2$ film which is formed on a surface of said single crystal SiC base material or said polycrystalline plate by thermally oxidizing said base material or said plate itself is used as said organic or inorganic substance which forms said intermediate layer and which contains Si and O as fundamental components.

14. A method of producing single crystal SiC according to claim 8, wherein said heat treatment is performed at a temperature of 2,200° C. or higher, and in an atmosphere of a saturated SiC vapor pressure or in the vicinity of the pressure.

15. A method of producing single crystal SiC according to claim 8, wherein said heat treatment is performed while a complex in which said polycrystalline plate is formed to be larger than said single crystal SiC base material is placed on a support table in a heat treatment oven so that a portion which is on a side of said single crystal SiC base material and which is smaller is positioned in a lower side.

16. A method of producing single crystal SiC according to claim 15, wherein a graphite sheet is laid on a face of said support table in said heat treatment oven, said single crystal SiC base material being to be placed on said face.

* * * * *